United States Patent
Ganapathi et al.

(10) Patent No.: US 11,042,957 B1
(45) Date of Patent: Jun. 22, 2021

(54) IDENTIFICATION OF PROCESS AND CONTROL LINKAGES FROM CUSTOM GRAPHICS FOR THE PURPOSE OF BACKBUILDING STANDARD OPERATING PROCEDURES

(71) Applicant: Honeywell International Inc., Morris Plains, NJ (US)

(72) Inventors: Ramakrishnan Ganapathi, Karnataka (IN); Rakshitha Prabhu, Karnataka (IN); Prangya Priyadarsini, Karnataka (IN)

(73) Assignee: Honeywell International Inc., Charlotte, NC (US)

(*) Notice: Subject to any disclaimer, the term of this patent is extended or adjusted under 35 U.S.C. 154(b) by 0 days.

(21) Appl. No.: 16/711,791

(22) Filed: Dec. 12, 2019

(51) Int. Cl.
   *G06T 1/20* (2006.01)
   *G06T 7/00* (2017.01)
   *G06T 7/70* (2017.01)
   *G06T 7/11* (2017.01)

(52) U.S. Cl.
   CPC .............. *G06T 1/20* (2013.01); *G06T 7/0004* (2013.01); *G06T 7/11* (2017.01); *G06T 7/70* (2017.01)

(58) Field of Classification Search
   CPC . G06T 1/20; G06T 7/0004; G06T 7/11; G06T 7/70
   USPC ........................................................ 345/522
   See application file for complete search history.

(56) References Cited

U.S. PATENT DOCUMENTS

| | | |
|---|---|---|
| 5,255,354 A | 10/1993 | Mahoney |
| 5,404,411 A | 4/1995 | Banton et al. |
| 5,568,568 A | 10/1996 | Takizawa et al. |
| 6,088,483 A | 1/2000 | Nakano et al. |
| 7,151,854 B2 | 12/2006 | Shen et al. |
| 7,502,519 B2 | 3/2009 | Eichhorn et al. |
| 7,593,780 B2 | 9/2009 | Mann et al. |
| 7,653,238 B2 | 1/2010 | Stentiford |
| 8,229,579 B2 | 7/2012 | Eldridge et al. |
| 8,447,076 B2 | 5/2013 | Yamamoto et al. |
| 8,516,383 B2 | 8/2013 | Bryant et al. |
| 8,629,877 B2 | 1/2014 | Bakalash et al. |
| 9,256,472 B2 | 2/2016 | Kakade et al. |
| 9,342,859 B2 | 5/2016 | Ayanam et al. |
| 9,547,291 B2 | 1/2017 | Tran et al. |
| 9,551,986 B2 | 1/2017 | Lo |
| 2002/0085020 A1 | 7/2002 | Carroll, Jr. |
| 2002/0194190 A1* | 12/2002 | Shema ................... G06F 16/94 |
| 2008/0189637 A1 | 8/2008 | Krajewski et al. |
| 2008/0189638 A1 | 8/2008 | Mody et al. |
| 2009/0153528 A1 | 6/2009 | Orr |
| 2014/0062975 A1* | 3/2014 | Panvelwala ........... G06F 3/1446 |
| | | 345/204 |
| 2015/0105876 A1 | 4/2015 | Tran et al. |
| 2015/0105893 A1 | 4/2015 | Tran et al. |
| 2015/0277404 A1 | 10/2015 | Maturana et al. |

* cited by examiner

*Primary Examiner* — Jacinta M Crawford
(74) *Attorney, Agent, or Firm* — Paschall & Associates, LLC; Anthony Miologos

(57) ABSTRACT

A method and the corresponding apparatus are carried out to interpret custom graphics to compile all of the equipment and relationships of the equipment, controls, the relative hierarchy of the graphics and other elements in a manufacturing plant and to then use all of that information to produce a standard operating procedure.

16 Claims, 5 Drawing Sheets

IDENTIFICATION OF PROCESS AND CONTROL LINKAGES FROM CUSTOM GRAPHICS FOR THE PURPOSE OF BACKBUILDING STANDARD OPERATING PROCEDURES

This disclosure relates generally to industrial process control and automation systems. More specifically, this disclosure relates to a system and method for automatically generating standard operating procedures from a plant's data.

BACKGROUND

Industrial process control and automation systems are often used to automate large and complex industrial processes. These types of systems routinely include sensors, actuators, and controllers. Some of the controllers typically receive measurements from the sensors and generate control signals for the actuators. Other controllers often perform higher-level functions, such as planning, scheduling, and optimization operations. A distributed control system (DCS) is often implemented in conjunction with or as part of an industrial process control and automation system. Such DCS systems include applications with graphical displays for a user to observe and control components and processes of the industrial process control and automation system Standard Operating procedures (SOP) of process plants describe the sequences and procedures including the start of the process, the safe stopping/shutting down of the process, the safe and efficient operation of the process under various loads and throughputs, the response to abnormal situations, monitoring emergency shutdown (ESD), if it arises and isolating the necessary devices from operations for carrying out maintenance and returning operations after maintenance. SOP is written using the design of the process and control system. The same is used for the training of operators on process control; as well for their evaluation how well they have performed the operation. Alarm management and operator efficiency evaluation system need SOP as part of the configuration. SOP available in the plants are not commonly defined against this need and sometimes it is not up-to-date in reflecting the changes in the plant operation that crept in over a period of years. Process experts should therefore spend a significant amount of their precious time configuring the rules for process operation in the tools of alarm management and operator efficiency assessment tools. This is not desirable and efficient and accurate.

SUMMARY

In one embodiment is provided a method comprising receiving a plurality of graphics files associated with a control system for an industrial process, each graphics file comprising a plurality of graphics objects; parsing the graphics files to identify primitive graphic objects in each graphics file; determining relationships among the identified primitive graphic objects to determine a group of primitive graphic objects that form one component of the industrial process; determining one or more patterns among the identified primitive graphic objects; saving the one or more patterns in a pattern library; identifying a display hierarchy and establish across display connections; reconstruct connections using display levels; and then constructing a standard operating procedure. 2. The pattern library may include a mapping between each pattern of the one or more patterns and a corresponding shape in a target graphics file. The method may further comprise cropping the one or more patterns from the graphics files; and identifying a pattern category for each of the one or more patterns. The identifying of the pattern category for each of the one or more patterns may comprise categorizing each pattern as a particular type of object using clustering and decision tree algorithms. The parsing the legacy graphics files comprises determining coordinates on X and Y axes of each primitive graphic object in the legacy graphics files. The method may further comprise aggregating repeated or lumped discrete objects to identify the objects as a single object. Aggregating the repeated or lumped discrete elements comprises aggregating multiple repeated line segments or lines with an arrow head and replacing the discrete objects with a single line object. The primitive graphics objects comprise at least one of a group of repeated lines that appear as a dashed line for a control connection; a line and a polygon that appear as an arrow head; and multiple line segments that are combined to form one process line.

In another embodiment, the invention is an apparatus comprising at least one processing device configured to receive a plurality of graphics files associated with a control system for an industrial process, each graphics file comprising a plurality of graphics objects; parse the legacy graphics files to identify primitive graphic objects in each legacy graphics file; determine relationships among the identified primitive graphic objects to determine a group of primitive graphic objects that form one component of the industrial process; identify a display hierarch and establish across display connections; reconstruct connections using display levels and construct a standard operating procedure.

The pattern library may include a mapping between each pattern of the one or more patterns and a corresponding shape in a target graphics file. The at least one processing device may be further configured to crop the one or more patterns from the graphics files; and identify a pattern category for each of the one or more patterns. In order to identify the pattern category for each of the one or more patterns, the at least one processing device is configured to categorize each pattern as a particular type of object using clustering and decision tree algorithms. In order to parse the graphics files, the at least one processing device is configured to determine coordinates on X and Y axes of each primitive graphic object in the graphics files. The at least one processing device is further configured to aggregate repeated or lumped discrete objects to identify the objects as a single object. In order to aggregate the repeated or lumped discrete elements, the at least one processing device is configured to aggregate multiple repeated line segments or lines with an arrow head and replacing the discrete objects with a single line object. The primitive graphics objects may comprise at least one of a group of repeated lines that appear as a dashed line for a control connection; a line and a polygon that appear as an arrow head; and multiple line segments that are combined to form one process line.

In another embodiment of the invention is provided a non-transitory computer readable medium containing instructions that when executed cause at least one processing device to receive a plurality of legacy graphics files associated with a control system for an industrial process, each legacy graphics file comprising a plurality of legacy graphics objects; parse the legacy graphics files to identify primitive graphic objects in each legacy graphics file; determine relationships among the identified primitive graphic objects to determine a group of primitive graphic objects that form one component of the industrial process; determine one or more patterns among the identified primitive graphic objects; save the one or more patterns in a pattern library; identify a display hierarchy and establish across display connections; reconstruct connections using display levels; and construct a standard operating procedure. The pattern library includes a mapping between each pattern of the one or more patterns and a corresponding shape in a target graphics file.

DETAILED DESCRIPTION

The Figures discussed below and the various embodiments used to describe the principles of the present invention in this document are by way of illustration only and should not be construed in any way to limit the scope of the invention. Those skilled in the art will understand that the principles of the invention may be implemented in any type of suitably arranged device or system.

Figure 1:
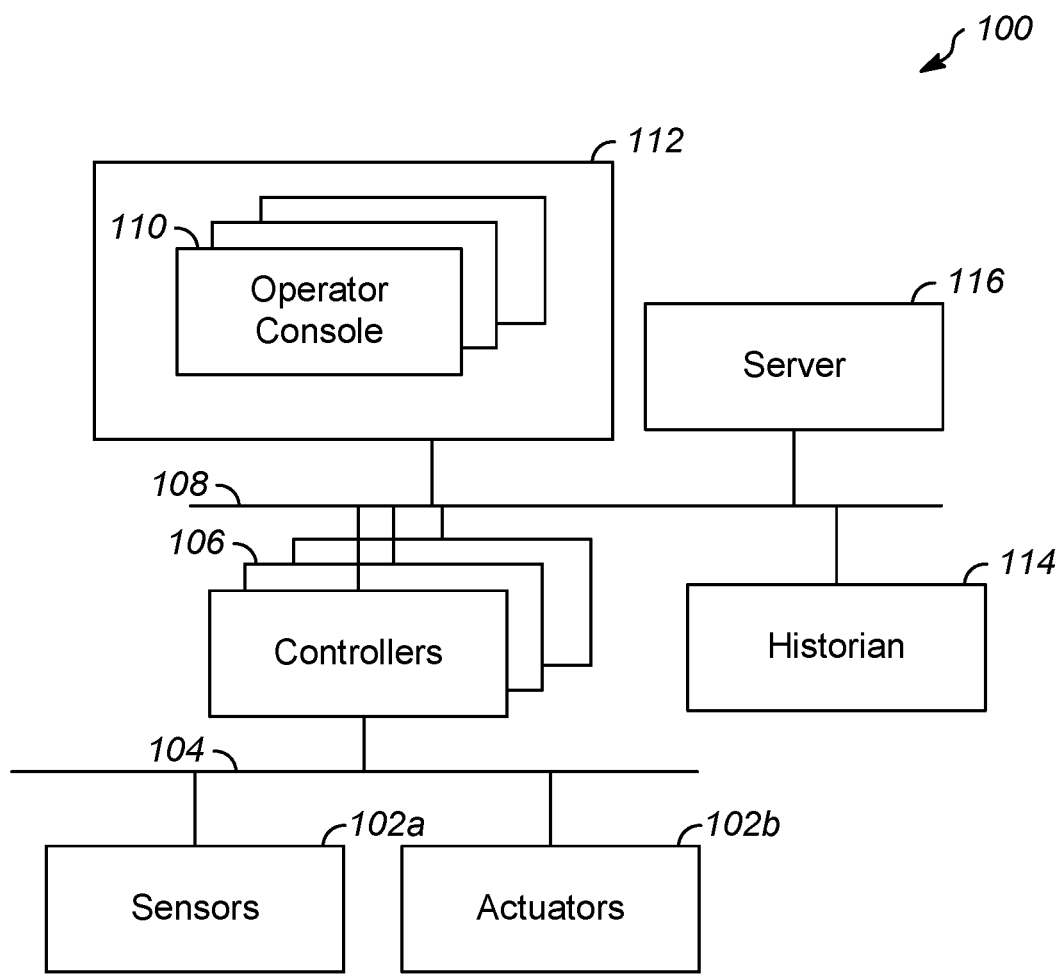
FIG. 1 is an example of an industrial process control and automation system.

FIG. 1 illustrates an example industrial process control and automation system 100 according to this disclosure. As shown in FIG. 1, the system 100 includes various components that facilitate production or processing of at least one product or other material. For instance, the system 100 can be used to facilitate control over components in one or multiple industrial plants. Each plant represents one or more processing facilities (or one or more portions thereof), such as one or more manufacturing facilities for producing at least one product or other material. In general, each plant may implement one or more industrial processes and can individually or collectively be referred to as a process system. A process system generally represents any system or portion thereof configured to process one or more products or other materials m some manner.

In FIG. 1, the system 100 includes one or more sensors 102*a* and one or more actuators 102*b*. The sensors 102*a* and actuators 102*b* represent components in a process system that may perform any of a wide variety of functions. For example, the sensors 102*a* could measure a wide variety of characteristics in the process system, such as pressure, temperature, or flow rate. Also, the actuators 102*b* could alter a wide variety of characteristics in the process system. Each of the sensors 102*a* includes any suitable structure for measuring one or more characteristics in a process system. Each of the actuators 102*b* includes any suitable structure for operating on or affecting one or more conditions in a process system.

At least one network 104 is coupled to the sensors 102*a* and actuators 102*b*. The network 104 facilitates interaction with the sensors 102*a* and actuators 102*b*. For example, the network 104 could transport measurement data from the sensors 102*a* and provide control signals to the actuators 102*b*. The network 104 could represent any suitable network or combination of networks. As particular examples, the network 104 could represent at least one Ethernet network, electrical signal network (such as a HART network), pneumatic control signal network, or any other or additional type(s) of network(s).

The system 100 also includes various controllers 106. The controllers 106 can be used in the system 100 to perform various functions in order to control one or more industrial processes. For example, a first set of controllers 106 may use measurements from one or more sensors 102*a* to control the operation of one or more actuators 102*b*. A second set of controllers 106 could be used to optimize the control logic or other operations performed by the first set of controllers. A third set of controllers 106 could be used to perform additional functions. The controllers 106 can communicate via one or more networks 108 and associated switches, firewalls, and other components.

Each controller 106 includes any suitable structure for controlling one or more aspects of an industrial process. At least some of the controllers 106 could, for example, represent proportional-integral-derivative (PID) controllers or multivariable controllers, such as controllers implementing model predictive control or other advanced predictive control. As a particular example, each controller 106 could represent a computing device running a real-time operating system, a WINDOWS operating system, or other operating system.

Operator access to and interaction with the controllers 106 and other components of the system 100 can occur via various operator consoles 110. Each operator console 110 could be used to provide information to an operator and receive information from an operator. For example, each operator console 110 could provide information identifying a current state of an industrial process to the operator, such as values of various process variables and alarms associated with the industrial process. Each operator console 110 could also receive information affecting how the industrial process is controlled, such as by receiving setpoints or control modes for process variables controlled by the controllers 106 or other information that alters or affects how the controllers 106 control the industrial process. Each operator console 110 includes any suitable structure for displaying information to and interacting with an operator. For example, each operator console 110 could represent a computing device running a WINDOWS operating system or other operating system.

Multiple operator consoles 110 can be grouped together and used in one or more control rooms 112. Each control room 112 could include any number of operator consoles 110 in any suitable arrangement. In some embodiments, multiple control rooms 112 can be used to control an industrial plant, such as when each control room 112 contains operator consoles 110 used to manage a discrete part of the industrial plant.

The control and automation system 100 also includes at least one historian 114 and one or more servers 116. The historian 114 represents a component that stores various information about the system 100. The historian 114 could, for instance, store information that is generated by the various controllers 106 during the control of one or more industrial processes. The historian 114 includes any suitable structure for storing and facilitating retrieval of information. Although shown as a single component here, the historian 114 could be located elsewhere in the system 100, or multiple historians could be distributed in different locations in the system 100. Each server 116 denotes a computing device that executes applications for users of the operator consoles 110 or other applications. The applications could be used to support various functions for the operator consoles 110, the controllers 106, or other components of the system 100. Each server 116 could represent a computing device running a WINDOWS operating system or other operating system.

In order to provide system status, various components of the system 100 (e.g., the sensors 102a, actuators 102b, and controllers 106) can be represented graphically on a display of one or more operator consoles 110. In many cases, each component is displayed as a preconfigured or custom graphic that is unique for that component or type of component. For example, when an actuator 102b is a valve, the valve can be displayed as a graphic that has the appearance of a valve. When a sensor 102a is a temperature gauge, the temperature gauge can be displayed as a graphic that has the appearance of a temperature gauge.

Generally, each control system or version of control system has a library of graphics associated with that system or version. When it is time for a migration to a new control system or version (e.g., due to obsolescence of the legacy system), the graphics representing the system components typically are migrated as well. For example, for a migration to a new DCS (distributed control system) solution (such as EXPERION by HONEYWELL), the legacy graphics can be replaced with or migrated to modem Human Machine Interface (HMI) graphics in order to provide an enhanced user interface experience.

Image processing techniques exist to translate or migrate legacy graphics into modem HMI graphics. For example, U.S. patent application Ser. No. 15/953,072 describes such techniques. However, characteristics of some legacy graphics objects inhibit full and comprehensive use of these existing techniques. For example, some legacy graphics objects (e.g., process lines representing process connections, instrument lines indicating the process taping or point of measurement, control connections, and the like) are composed of multiple repeated line segments and custom arrow heads (created by combining many line segments). These objects can be difficult to map or translate unless they are aggregated suitably as connections between objects. As another example, there are objects that are used in legacy graphics with little variation from the parent object in some of the instances of usage.

These gaps in mapping success bring down the translation efficiency and require manual labor to fix the translation gaps. Such manual effort can be expensive and does not allow the user to reap the full benefits of automated translation. Also, end users tend to view the translation as either a complete translation or an inferior partial translation, regardless of how close to complete the degree of translation may be. Hence, for user satisfaction, the translation should be total.

To address these and other issues, embodiments of this disclosure provide an object aggregation and standardization solution that substantially enhances migration efficiency. The disclosed embodiments apply analytics and image processing for grouping and identifying unique industrial objects, assets, or devices. These embodiments use analytics to aggregate repeated or lumped discrete elements to identify the elements as a single object. The embodiments then find the equivalent object in the new HMI graphics. Additionally, the embodiments also identify grouped objects and map them appropriately to an HMI shape.

The disclosed embodiments aggregate multiple repeated line segments or lines with an arrow head and replace the discrete objects with a single line object by applying its relevant properties for the direction indication. The disclosed embodiments identify the pattern using object coordinates. The disclosed embodiments categorize the pattern using clustering and decision tree algorithms. The disclosed embodiments create a library of unique industrial objects, devices, and assets using image processing. The uniqueness can be agnostic to associated text, size, and color.

The disclosed embodiments can be used as part of a graphics conversion for identifying assets and replacing with standard shapes from the HMI shape library. The identification can also be used for on-job competency analysis for identifying process flows across the assets. In some embodiments, one or more of the components in FIG. 1 (such as the operator consoles 110, the historian 114, or the server 116) could be configured to perform these operations.

Although FIG. 1 illustrates one example of an industrial process control and automation system 100, various changes may be made to FIG. 1. For example, the system 100 could include any number of sensors, actuators, controllers, networks, operator stations, control rooms, historians, servers, and other components. Also, the makeup and arrangement of the system 100 in FIG. 1 is for illustration only. Components could be added, omitted, combined, further subdivided, or placed in any other suitable configuration according to particular needs. Further, particular functions have been described as being performed by particular components of the system 100. This is for illustration only. In general, control and automation systems are highly configurable and can be configured in any suitable manner according to particular needs. In addition, FIG. 1 illustrates one example operational environment supporting objects aggregation and standardization for legacy graphics conversion. This functionality can be used in any other suitable system.

As discussed above, in custom graphics, groups of objects can be used to represent single objects or container objects. For example, to represent container objects like a tank, boiler, or furnace, a combination of primitive objects (e.g., rectangles, polygons, arcs, line segments, and the like) is often used. These combinations are unique in individual ways. These combinations can be of primitive objects alone or combination of primitive objects and embedded pictures.

In some industrial graphical displays, a process line for connection of objects is represented with repeated line segments or polygon objects. These can be represented in HMI as a single line and by setting its properties. The representations are typically different across sites as it depends on the engineering being performed.

In some conventional migration solutions, the graphical object conversions are done one to one. That is, the repeated line segments forming some objects are converted as multiple objects in HMI. Hence the number of objects is greater than necessary. In contrast, the disclosed techniques identify all instances of repeated and grouped objects, aggregate them, and replace the multiple objects with one relevant HMI object or shape.

By applying a few methodologies in sequence, the problem of static conversion can be addressed. These methodologies can include the following: Aggregation logic for process lines to connect objects. Form patterns using rules applied on object coordinates and extract the pattern in the image format. Retain these patterns in the global pattern library. Apply image processing for uniqueness validation of the patterns. Categorize the patterns as a particular type of object (e.g., tank, boiler, furnace, etc.) using clustering and decision tree algorithms.

Figure 2:
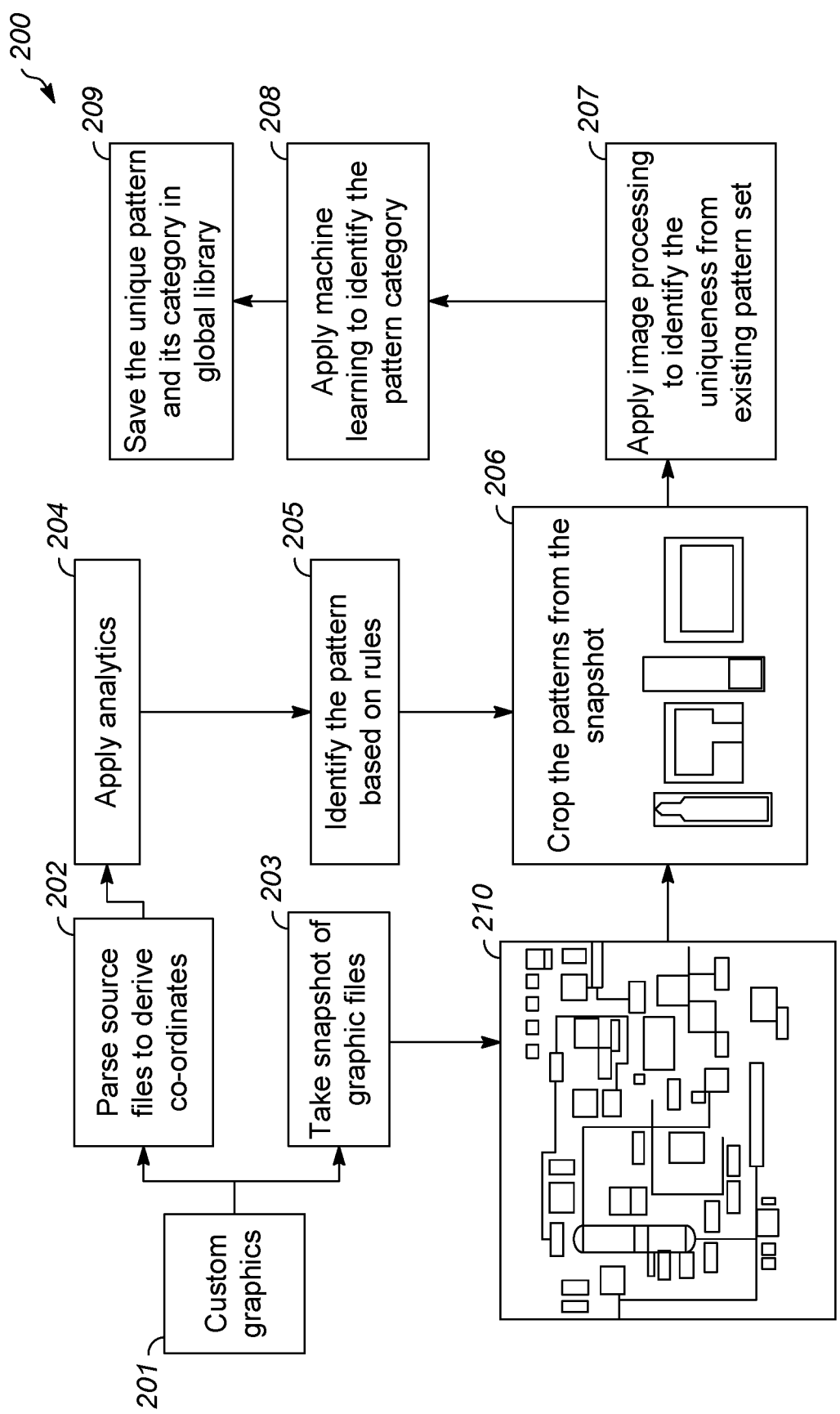
FIG. 2 is an example of a method for objects aggregation and standardization for legacy graphics conversion.

FIG. 2 illustrates an example method 200 for objects aggregation and standardization for legacy graphics conversion according to this disclosure. The method 200 could, for example, be used for translation of graphics that are displayed at one or more operator consoles 110 in the system 100 of FIG. 1. However, the method 200 could be used with any other suitable system. For ease of explanation, the method 200 may be described as being performed using a computing device. The method 200 may be performed in an on-premise system, a cloud hosted system, or any other suitable system. At block 201, custom graphics files from the legacy system are received as input to the process 200. The legacy graphics files are graphics files containing one or more legacy graphics objects for use in a legacy control system Screen image 210 illustrates a graphic image of one legacy graphics file. In particular embodiments, the legacy graphics files are HONEYWELL US graphics files (having a .DS file extension) or GUS graphics files (having a .PCT file extension). In some cases, as a preceding step, US (DS) graphics files are converted to the GUS file type. In order to improve the standardization results, many (e.g., hundreds) of legacy graphics files can be considered.

At block 202, the legacy graphics files are parsed to derive coordinates of primitive graphic objects (lines, arcs, polygons, etc.) in each legacy graphics file. This entails examining the raw data in the graphics files and parsing the raw data to determine what graphic objects are comprised in the graphic files. The raw data is also parsed to determine coordinates on the X and Y axes (e.g., the horizontal and vertical location on the display) of each primitive graphic object in the file. These coordinates are used when the graphic object is converted to the HMI format. During the conversion to HMI format, the graphic object may be resized to account for differences in resolution and aspect ratio between the legacy display and the HMI display. The graphic object can be placed in a corresponding location in the HMI display compared to the legacy display, while accounting for differences in resolution and aspect ratio.

At block 203, graphic snapshots are taken of the legacy graphics files. Each graphic snapshot represents a screen image that can be displayed using the legacy graphics files. For example, the screen image 210 can be one example of a graphic snapshot.

Figure 3:
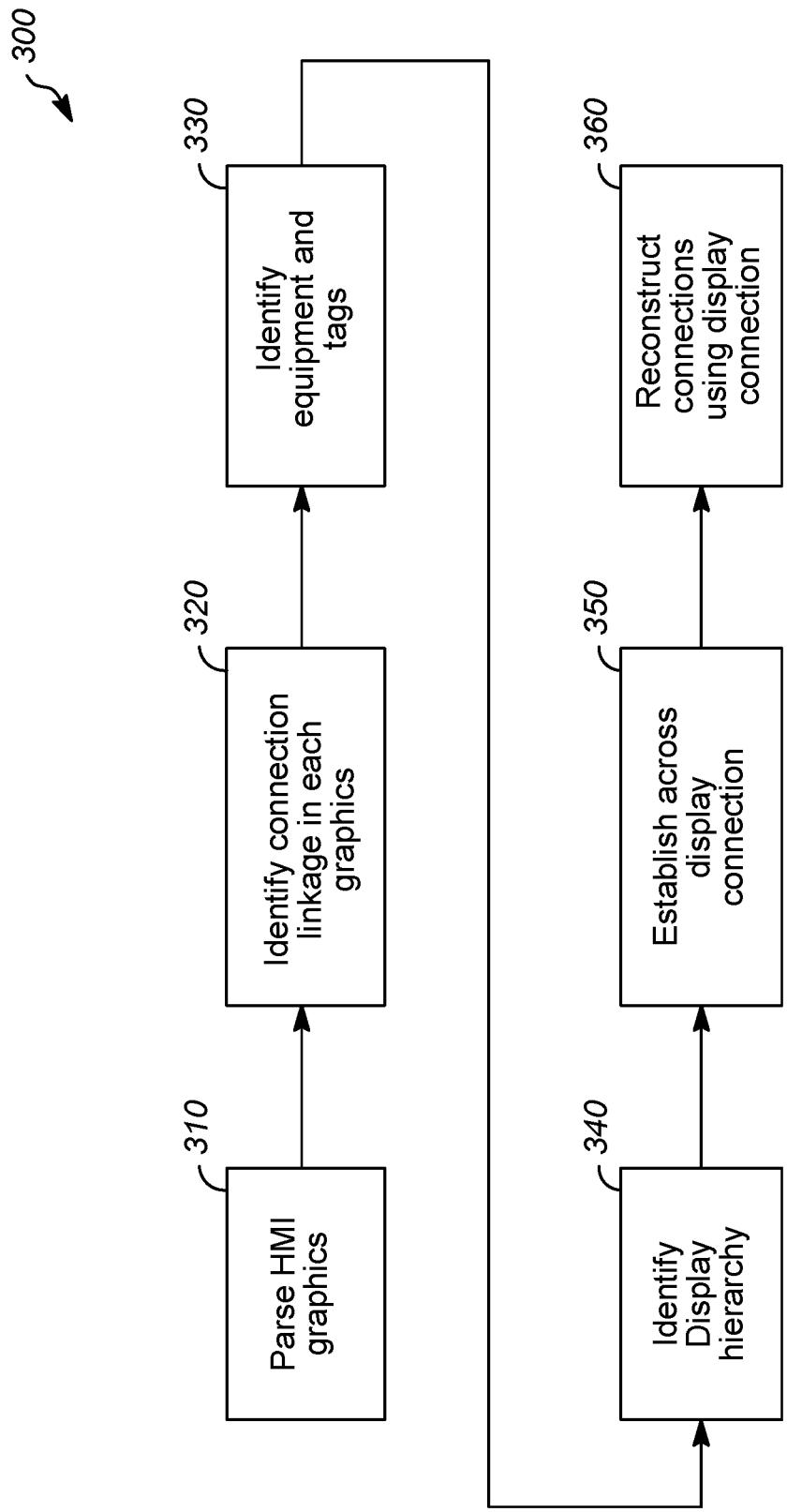
FIG. 3 is a basic flow scheme of the invention.

At block 204, analytics are applied to determine relationships among the identified primitive graphic objects. In legacy graphics files, some primitive graphic objects (lines, arcs, polygons, etc.) are grouped together to form one single element, such as a tank, pump, or furnace. For example, FIG. 3 shows a screen image 300 from a legacy US or GUS source graphics file. The tanks 301-302 in the image 300 appear to be one cylindrical object. However, each tank 301-302 is stored in the graphics file as multiple primitive objects (e.g., a rectangle and four arcs).

An image generation algorithm is performed to determine one or more patterns among the identified primitive graphics objects. For example, a set of line segments can be a line, a set of four lines can be a rectangle, and a set of four arcs can be a circle. Analytics are applied to the graphics raw data to determine if groups of objects are related (e.g., do the objects touch, do the objects overlap, etc.). A clustering algorithm can be used for these analytics. Once it is determined that multiple objects form a group based on their relationships, a decision tree algorithm can be applied to determine what category the particular group of objects belongs to.

At block 205, patterns are identified based on one or more rules. In legacy graphics, to form container objects or to represent an asset, multiple primitive objects or embedded objects are grouped together in a pattern. Of course, an individual embedded object which is not grouped can also represent as asset. In HMI, these can be designed using a single object or a shape.

Identifying these combinations or patterns from the legacy graphics is not straightforward. This requires understanding of the objects being placed from the object coordinate system Moreover, objects that overlap and form a group may be identified using an overlapped objects algorithm.

In legacy graphics, images of process connections are typically represented in one of the three cases described below: Case 1: Control connections are represented with a group of repeated lines that appear as a dashed line, case 2: A process line is ended with a polygon object to have the appearance of an arrow head and case 3: Multiple line segments are combined to form one process line.

This disclosure provides a method of automatically generating a standard operating procedure (SOP) from the plant data. Process operation is carried out using custom graphics, mimicking the process, built under DCS. Custom graphics are developed considering and applying the rules in SOP. Custom graphics include all process, instrument and control connections. Control configuration include process limits, interlocks and additional operation rules.

A careful interpretation of these graphics and control configurations can recreate the standard operating procedures. This includes changes implemented over time, as the source data that is used including custom graphics and control configurations always include all the changes.

This SOP can be approved by a process expert and used in the tools after being reviewed and approved. The production of the SOP in this manner eliminates a substantial amount of process experts' time. Also, the resulting SOP is more accurate and up-to-date results. This process eliminates the upkeep of SOP and the derived SOP can be used for multiple purposes such as training or documentation of process improvements with accurate and up-to-date results. This eliminates the manual upkeep of SOP and the derived SOP can be used for multiple purposes.

Huge sets of custom graphics are available for plant operations. These are generally divided into various hierarchy based on the usage during the operations. In one embodiment, the graphics are divided into Level 1, Level 2, Level 3 and Level 4 graphics. The information in these are based on the relevance pertaining to graphics.

Level 1 graphics are the overview displays. Level 2 are the individual area or unit level displays. Level 3 are the operational displays and Level 4 are the popup or faceplate displays. The combination of all these levels of display helps in deriving the standard set of operations in the process.

The following procedure assists in identifying the complete details from the graphical displays.

The process involves first parsing HMI graphics, identifying the connection linkage between each of the graphics, identifying equipment and relevant tags, identifying display hierarchy, establishing across display connection and reconstructing connections using display levels.

Parsing the HMI graphics involves the following activities: The graphic raw file is expected to have all the information of the objects that are a part of the graphics. To understand these details, it is needed to get the graphic files and parse those files. Once the graphic file is parsed as to the objects, its properties and the actions associated to it are converted to an understandable format. These details are further processed to identify the process and control connections. In a sample graphics file, the raw information present when the graphics file is read provides the types of objects from which the file is made of. For example, object types are lines with solid property, lines with dashed property, shapes etc. may be used to indicate the nature of the object or the connection to the other objects.

The next step is to identify process and control connections. Once the raw information is processed, this information is used to identify the objects and relations across objects. To identify the relationship, first it is necessary to identify what each of the objects pertain to. The objects in a display either represent equipment or the connections across and between the equipment and the displays. At first, the type of equipment is identified in a display by using an object aggregation technique as described above. Once the equipment is identified, the individual line details attached to the equipment and its line type are used to identify the type of connections the equipment relate to. Ideally the types of connections are either process, instrument or utility connections. In one embodiment, the thick lines represent process lines, the dashed line represents an instrument or the tapping line and the thin lines are the utility lines.

With the help of above variations, it is possible to identify in what manner the equipment is connected and their functional specifications.

FIG. 3 shows the basic flow scheme 300 of the invention. The first step shown is to parse HMI graphics 310, then to identify the connection linkage in each graphic 320, identify equipment and tags 330, identify the display hierarchy 340, establish across display connection 350 and then reconstruct connections using display levels 360.

Thick solid lines may represent the process flow across the equipment. For example, a flow to the equipment combustion chamber on the right side of the FIG. 4 that is controlled by various control valves through the process lines. The information or the control operations to the control valve are represented through the dashed line into a tag box. This indicates the control parameter associated to the equipment and helps for the call out for the alarm on abnormal situations. For example, the flow to a combustion chamber is controlled by a control valve (not spelled out on drawing).

After the equipment has been identified, the next step is to identify all tags associated with the equipment. Once the individual equipment's are identified, the tags associated to it are understood by the graphical file information. This information may include the flow being sent to the identified equipment or a control valve and its function. This information shall be available in the display raw data. The control valve FC3 shall have a tag information that represents the flow to the combustion chamber XXX01. Therefore, with the information of the equipment type and its flow parameters, it can be derived that combustion chamber XXX01 is controlled by a control valve FC3, which in turn with the help of the tags associated to it derives the tag to tag relation for this equipment. Also, based on the tag naming convention, the type of operations involved can be derived that can be made on the equipment such as whether the properties of the equipment involve flow control, temperature control, temperature indicator and so on. This information helps deriving whether the tags are can be operated as part of the operator actions based on its parameter variance.

In a particular flow scheme, an example of a tag is shown in the following table. Flow control may be changed while a temperature indicator is not actionable in that it is showing data.

| TAG | Control Type | Actionable |
|---|---|---|
| XXFC007 | Flow Control | Yes |
| XXTI114 | Temperature Indicator | No |

An Example of TAG and Equipment Linkage:

| Equipment | TAG | Equipment | TAG | Connection Flow |
|---|---|---|---|---|
| Control Valve | XXFC003 | Combustion Chamber | XXTA810 | Process |

As mentioned earlier the displays are distributed hierarchically. Based on the associations across displays, this hierarchy of the displays can be identified by the relation or association across the display that can be identified through the navigation parameters of the display. The flow for a control valve is shown coming from a navigation display. With help of this navigation either the linkage across displays can be identified or the navigation across the displays can be achieved. This information helps in defining the layering or leveling of the connections across the displays. From the raw information of the display, the relation or association across the display can be identified through the navigation parameters of the display.

Figure 4:
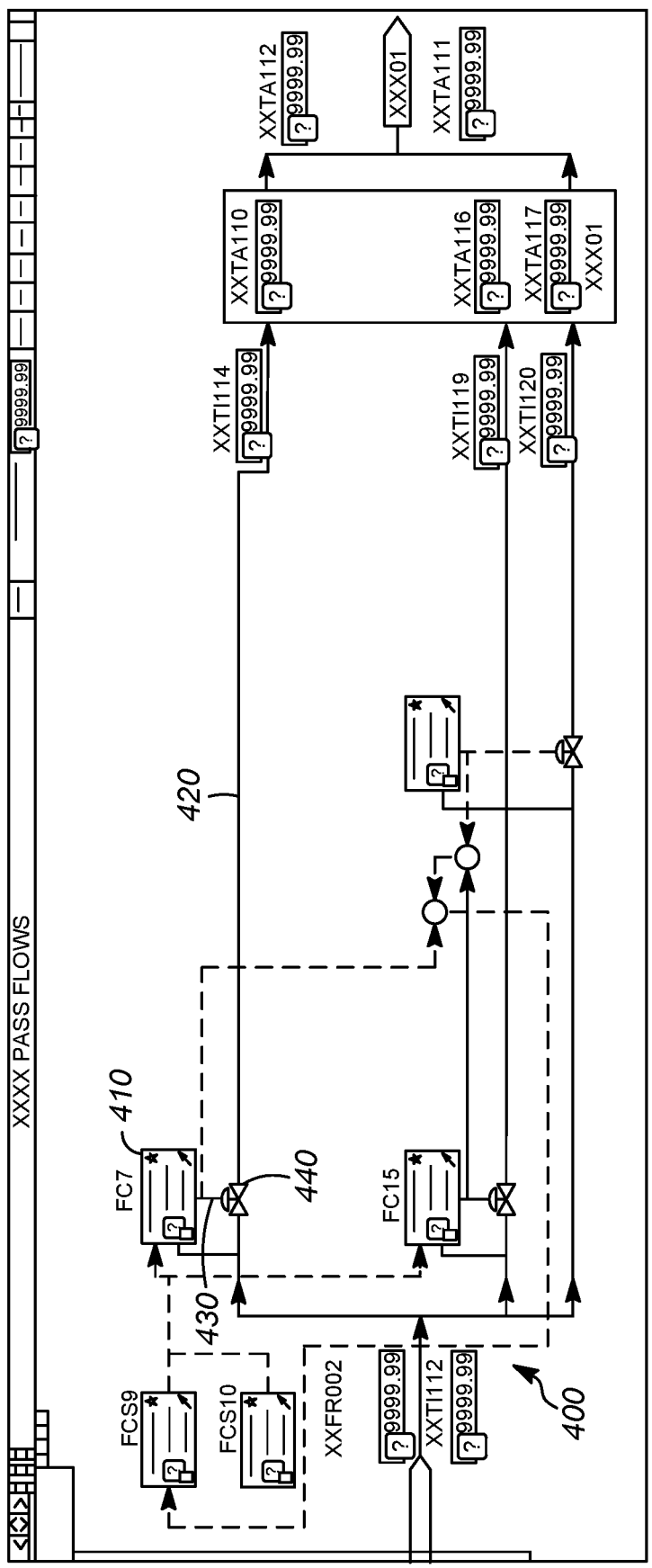
FIG. 4 shows a series of connected equipment.

In FIG. 4, is shown that there are a series of equipment that are connected, generally indicated as 400. A flow controller 410 is one of such elements shown. Solid lines such as line 420 indicate a process flow. Valve 440 is available to throttle flow. Dotted lines such as 430 indicate control connections between a flow controller 410 and a valve 440. These may include the flow for a control valve is coming from a navigation display XXX69 from the left to it. With help of this navigation either the linkage across displays can be identified or the navigation across the displays can be achieved. This information helps in defining the layering or leveling of the connections across the displays.

The next step is to reconstruct connections using display levels. The tags shall be distributed across displays for the ease of information accessing in various levels of displays. But to identify the accurate connection flow parameters, the level 3 and level 4 displays are mainly used as these displays have the details of the even the minute equipment in that are available in the plant process operations.

Figure 5:
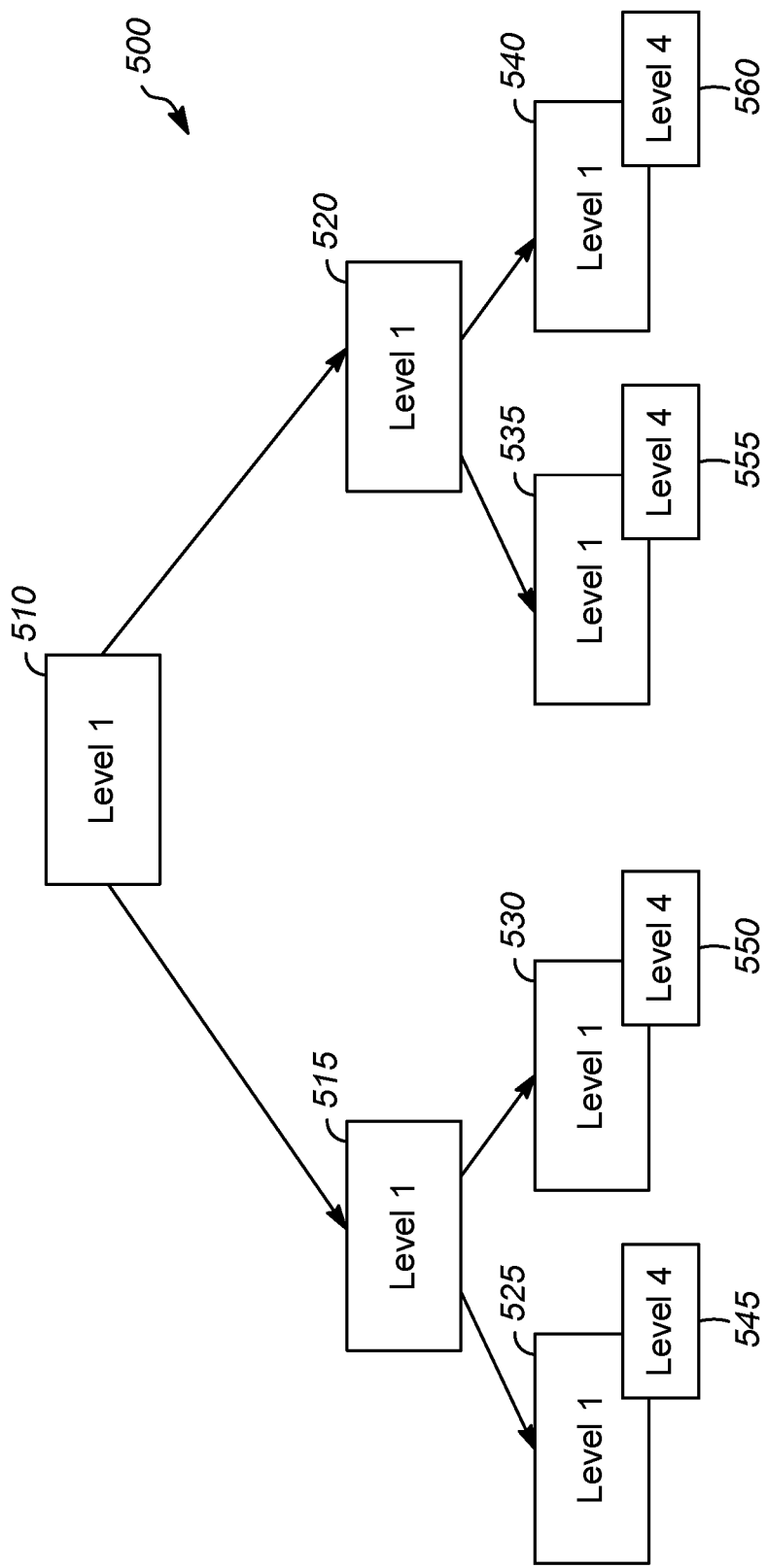
FIG. 5 shows the relative connections of two levels of tags within a display hierarchy.

Once the display hierarchy is identified, the tags are there as part of the level 1 and level 2 displays, these tags connections are reconstructed using the connections in the level 3 and level 4 displays. In FIG. 5 is shown an example 500 of the relative connections of Levels 1 (510, 515, 520, 525,530, 535, and 540) and level 4 (545, 550, 555, and 560) while other levels of connections may be added.

The HMI data is parsed by determining if a particular object is a shape that would correspond to equipment and then determine the tags, the relevant parameters and the objects of that equipment.

The information derived from the graphics files may be verified by having another source of information. One such source is information from the control system. For example, a vessel may be controlled by a cascaded level control that detects a level signal which in turn is linked to a flow signal that controls an associated flow valve to a then add liquid as required to maintain the level. These signals and controls are part of the control configuration for the process plant and will include control connection data that is generated and then used to verify the information derived from the graphics files for use in compiling a standard operating procedure for the process plant.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. 25 § 1 12(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 1 12(f).

The invention claimed is:

1. A method comprising:
receiving a plurality of legacy graphics files associated with a control system for an industrial process, each legacy graphics file of the plurality of legacy of graphic files comprising a plurality of graphics objects;
parsing the plurality of legacy graphics files to identify primitive graphic objects in each legacy graphics file;
determining relationships among the identified primitive graphic objects to determine a group of primitive graphic objects that form one component of the industrial process;
determining one or more patterns among the identified primitive graphic objects;
saving the one or more patterns in a pattern library;
identifying a display hierarchy and establish across display connections;
reconstructing the display connections using display levels;
constructing a standard operating procedure; and
aggregating repeated or lumped discrete graphic objects to identify the graphic objects as a single graphic object by aggregating multiple repeated line segments or lines with an arrow head and replacing the discrete graphic objects with a single line graphic object.

2. The method of claim 1, wherein the pattern library includes a mapping between each pattern of the one or more patterns and a corresponding shape in a target graphics file.

3. The method of claim 2, wherein the plurality of legacy graphics files are associated with an older version of the control system and the target graphics file is associated with a newer version of the control system.

4. The method of claim 1, further comprising:
cropping the one or more patterns from each of the legacy graphics files; and
identifying a pattern category for each of the one or more patterns.

5. The method of claim 4, wherein identifying the pattern category for each of the one or more patterns comprises categorizing each pattern as a particular type of graphic object using clustering and decision tree algorithms.

6. The method of claim 1, wherein parsing the plurality of legacy graphics files comprises determining coordinates on X and Y axes of each primitive graphic object in each of the legacy graphics files.

7. The method of claim 1, wherein the primitive graphics objects comprise at least one of:
a group of repeated lines that appear as a dashed line for a control connection;
a line and a polygon that appear as an arrow head; and
multiple line segments that are combined to form one process line.

8. The method of claim 1 further comprising analyzing control information from said control system to verify that said standard operating procedure is accurate.

9. An apparatus comprising:
at least one processing device configured to:
receive a plurality of legacy graphics files associated with a control system for an industrial process, each legacy graphics file comprising a plurality of graphics objects;
parse the plurality of legacy graphics files to identify primitive graphic objects in each legacy graphics file;
determine relationships among the identified primitive graphic objects to determine a group of primitive graphic objects that form one component of the industrial process;
identify a display hierarchy and establish across display connections;
reconstruct the display connections using display levels;
construct a standard operating procedure; and
aggregate repeated or lumped discrete graphic objects to identify the graphic objects as a single graphic object by aggregating multiple repeated line segments or lines with an arrow head and replacing the discrete graphic objects with a single line graphic object.

10. The apparatus of claim 9, wherein the pattern library includes a mapping between each pattern of the one or more patterns and a corresponding shape in a target graphics file.

11. The apparatus of claim 9, wherein the at least one processing device is further configured to:
crop the one or more patterns from each of the legacy graphics files; and
identify a pattern category for each of the one or more patterns.

12. The apparatus of claim 11, wherein to identify the pattern category for each of the one or more patterns, the at least one processing device is configured to categorize each pattern as a particular type of graphic object using clustering and decision tree algorithms.

13. The apparatus of claim 9, wherein to parse the plurality of legacy graphics files, the at least one processing device is configured to determine coordinates on X and Y axes of each primitive graphic object in each of the legacy graphics files.

14. The apparatus of claim 9, wherein the primitive graphics objects comprise at least one of a group of repeated lines that appear as a dashed line for a control connection; a line and a polygon that appear as an arrow head; and multiple line segments that are combined to form one process line.

15. A non-transitory computer readable medium containing instructions that when executed cause at least one processing device to:
  receive a plurality of legacy graphics files associated with a control system for an industrial process, each legacy graphics file comprising a plurality of legacy graphics objects;
  parse the plurality of legacy graphics files to identify primitive graphic objects in each legacy graphics file;
  determine relationships among the identified primitive graphic objects to determine a group of primitive graphic objects that form one component of the industrial process;
  determine one or more patterns among the identified primitive graphic objects;
  save the one or more patterns in a pattern library;
  identify a display hierarchy and establish across display connections;
  reconstruct the display connections using display levels;
  construct a standard operating procedure; and
  aggregate repeated or lumped discrete graphic objects to identify the graphic objects as a single graphic object by aggregating multiple repeated line segments or lines with an arrow head and replacing the discrete graphic objects with a single line graphic object.

16. The non-transitory computer readable medium of claim 15, wherein the pattern library includes a mapping between each pattern of the one or more patterns and a corresponding shape in a target graphics file.

\* \* \* \* \*